(12) United States Patent
Lai et al.

(10) Patent No.: US 11,551,955 B2
(45) Date of Patent: Jan. 10, 2023

(54) SUBSTRATE PROCESSING APPARATUS EQUIPPED WITH SUBSTRATE SCANNER

(71) Applicant: UNITED MICROELECTRONICS CORP., Hsin-Chu (TW)

(72) Inventors: Ming-Che Lai, Hsinchu (TW); Hua-Wei Peng, Hsinchu County (TW); Chia-He Cheng, Taichung (TW); Ming-Tso Chen, Hsinchu County (TW); Chao-Chi Lu, Hsinchu County (TW); Hsin-Hsu Lin, Miaoli County (TW); Kuo-Tsai Lo, New Taipei (TW); Kao-Hua Wu, Hsinchu County (TW); Huan-Hsin Yeh, Hsinchu County (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 299 days.

(21) Appl. No.: 16/831,739

(22) Filed: Mar. 26, 2020

(65) Prior Publication Data
US 2021/0280444 A1 Sep. 9, 2021

(51) Int. Cl.
*H01L 21/67* (2006.01)
*G05B 19/418* (2006.01)
*G06T 7/00* (2017.01)

(52) U.S. Cl.
CPC .... *H01L 21/67276* (2013.01); *G05B 19/4189* (2013.01); *G05B 19/41875* (2013.01); *G06T 7/0004* (2013.01); *G05B 2219/32368* (2013.01); *G05B 2219/37224* (2013.01); *G05B 2219/37558* (2013.01); *G05B 2219/45031* (2013.01); *G06T 2207/30148* (2013.01)

(58) Field of Classification Search
CPC ......... H01L 21/67276; H01L 21/67219; H01L 21/67288; H01L 22/12; H01L 21/67155; H01L 21/67739; G05B 19/41875; G05B 19/4189; G05B 2219/32368; G05B 2219/37224; G05B 2219/37558; G05B 2219/45031; G06T 7/0004; G06T 2207/30148; G06T 7/001
See application file for complete search history.

(56) References Cited

U.S. PATENT DOCUMENTS

| | | | |
|---|---|---|---|
| 5,859,698 | A | 1/1999 | Chau |
| 6,166,801 | A | 12/2000 | Dishon |
| 6,407,809 | B1 | 6/2002 | Finarov |
| 7,591,600 | B2 | 9/2009 | Dixon |
| 2018/0076099 | A1* | 3/2018 | Chou ............... H01L 22/20 |

* cited by examiner

*Primary Examiner* — Tejal Gami
(74) *Attorney, Agent, or Firm* — Winston Hsu

(57) ABSTRACT

A substrate processing apparatus includes a process station for processing a substrate; a cassette station integrated with the process station; a substrate carriage equipped for transferring the substrate between said process station and the cassette station through a passage located at an interface between the process station and said cassette station; and a substrate scanner equipped at said interface between the process station and the cassette station for capturing surface image data during transportation of the substrate that passes through the passage.

18 Claims, 3 Drawing Sheets

SUBSTRATE PROCESSING APPARATUS EQUIPPED WITH SUBSTRATE SCANNER

BACKGROUND OF THE INVENTION

1. Field of the Invention

The present invention relates to the field of semiconductor technology, and in particular, to a substrate processing apparatus integrated with a substrate scanner.

2. Description of the Prior Art

As well known in the art, a semiconductor device is manufactured by performing a series of processing such as cleaning, resist coating, exposure, development, etching, deposition, heat treatment and dicing on a substrate such as a wafer. In order to maintain the quality of such a semiconductor device, it is important to perform various inspections on the substrate after the process of the aforementioned processing stages, thereby confirming the quality.

The inspection processes are commonly carried out in the semiconductor manufacturing process to improve yield. Typically, a silicon wafer is inspected before and during the fabrication of the semiconductor device. Inspection of semiconductor devices identifies defects in the semiconductor devices due to errors in the formation of the devices, contamination by particles, and defects in the silicon wafer itself. Once defects have been identified, various yield improvement actions may be taken.

However, a waiting time for introduction into an inspection apparatus is necessary while a certain degree of time is required for ascertaining the result of the inspection, and hence a considerable number of substrates introduced into the apparatus subsequently to a certain substrate are completely processed before the inspection result as to this substrate is recognized. When the inspection result is unsatisfactory, therefore, the considerable number of substrates must be re-processed, resulting in reduction of the throughput of the overall processing.

Therefore, there is a need in this industry to provide an improve system such that the substrate can be properly inspected without reducing the throughput.

SUMMARY OF THE INVENTION

One object of the present invention is to provide an improved substrate processing apparatus that integrates a substrate scanner, which can solve the above-mentioned shortcomings and disadvantages of the prior art.

One aspect of the invention provides a substrate processing apparatus including a process station for processing a substrate; a cassette station integrated with the process station; a substrate carriage equipped for transferring the substrate between the process station and the cassette station through a passage located at an interface between the process station and the cassette station; and a substrate scanner equipped at the interface between the process station and the cassette station for capturing surface image data during transportation of the substrate that passes through the passage.

According to some embodiments, the substrate scanner comprises an image sensor device disposed above a top surface of the substrate.

According to some embodiments, the substrate scanner is a line scanner that captures line-shaped surface image of the substrate at a pre-selected line rate of about 4.5K line/second.

According to some embodiments, the substrate scanner has a pixel size of about 47 μm.

According to some embodiments, the substrate processing apparatus further includes a light emitting device disposed between the image sensor device and the top surface of the substrate.

According to some embodiments, the light emitting device produces a scan line impinging onto the top surface of the substrate, and wherein a reflected light comprising the surface image data is detected by the image sensor device.

According to some embodiments, the light emitting device comprises a filter that blocks blue light and UV light from a light source of the light emitting device.

According to some embodiments, the light source is light-emitting diode (LED) light source and has illuminance of about 50,000 lux According to some embodiments, a longitudinal length of the scan line is equal to or greater than a diameter of the substrate.

According to some embodiments, the light emitting device comprises a stripe-shaped transparent window that allows the scan line and the reflected light to pass therethrough.

According to some embodiments, the top surface of the substrate is completely scanned by the substrate scanner in two seconds.

According to some embodiments, the substrate processing apparatus further includes a transfer plate equipped in the process station, wherein the substrate is mounted on the transfer plate before being transported by the substrate carriage.

According to some embodiments, the transfer plate is a cooling plate for cooling the substrate.

According to some embodiments, the substrate carriage picks up the substrate from the transfer plate and passes through the passage at the interface between the process station and the cassette station in a constant moving speed when scanned by the substrate scanner.

According to some embodiments, the process station comprises a resist coating unit and a developing process unit.

According to some embodiments, the process station comprises a chemical mechanical polishing (CMP) station.

According to some embodiments, the process station comprises an etching station.

According to another aspect of the invention, a substrate processing apparatus includes a process station for processing a substrate; a cassette station integrated with the process station; a substrate carriage equipped for transferring the substrate between the process station and the cassette station through a passage located at an interface between the process station and the cassette station; and two substrate scanners equipped at the interface between the process station and the cassette station for capturing surface image data during transportation of the substrate that passes through the passage, wherein the two substrate scanners scan a top surface and a rear surface of the substrate, respectively.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

One technical feature of the present invention is that the inspection device is integrated into the wafer production or processing tool, and inline and real-time scanning of the substrate can be conducted when a substrate such as a wafer is transferred back to the cassette. By comparing the acquired image of the substrate with the normal image, it is possible to quickly find out where the wafer is abnormal, and immediately decide whether to continue the process flow or to rework. The present invention can also replace automatic optical inspection (AOI) steps such as after-develop-inspection (ADI) or after-etch-inspection (AEI).

Figure 1:
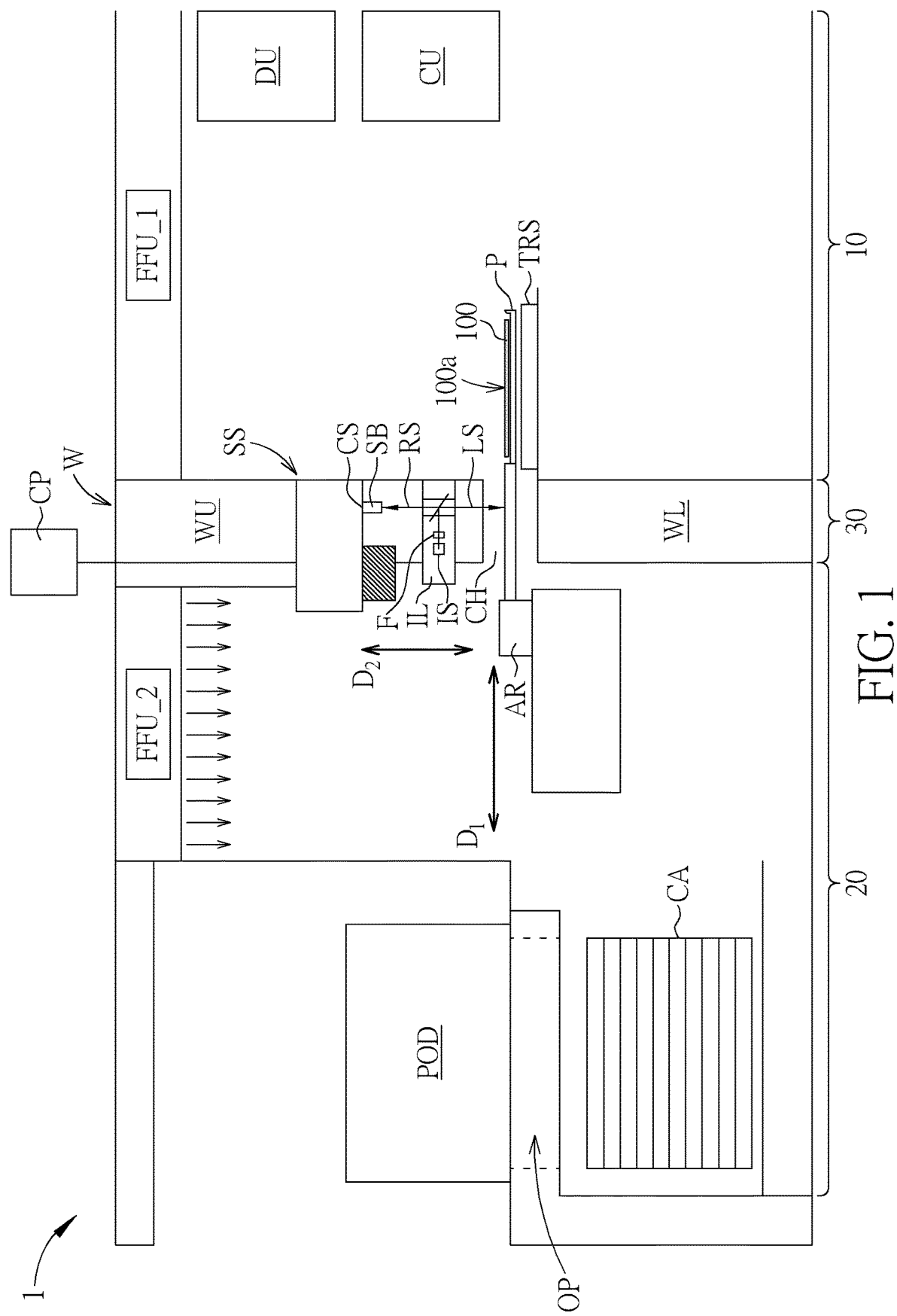
FIG. 1 illustrates a substrate processing apparatus according to an embodiment of the present invention.

Please refer to FIG. 1, which illustrates a substrate processing apparatus according to an embodiment of the present invention. As shown in FIG. 1, the substrate processing apparatus 1 includes a process station 10 for processing a substrate 100, such as a silicon wafer. For example, the process station 10 may include a resist coating unit CU and a developing process unit DU. The substrate 100 can be transferred to the resist coating unit CU or the development processing unit DU through a robot arm (not shown) provided in the process station 10, in order to perform the photoresist coating or development treatments, respectively. According to an embodiment of the present invention, the substrate 100 subjected to the photoresist coating may further be subjected to a subsequent exposure process.

The process station 10 of the present invention is not limited to a photoresist coating and developing tool. According to other embodiments of the present invention, the process station 10 may comprise a chemical mechanical polishing (CMP) station. According to other embodiments of the present invention, the process station 10 may comprise an etching station.

According to an embodiment of the present invention, the substrate processing apparatus 1 further includes: a cassette station 20 integrated with the process station 10. According to an embodiment of the present invention, a compartment wall W is provided at an interface 30 between the cassette station 20 and the process station 10, wherein the compartment wall W is provided with a passage CH, which allows the robot arm AR in the cassette station 20 to transfer the substrate 100 between the process station 10 and the cassette station 20, and transfers the substrate 100 to the cassette CA for storage. The cassette CA can be loaded into the wafer carrier POD through the opening OP.

According to an embodiment of the present invention, the compartment wall W may be a metal wall, but is not limited thereto. According to an embodiment of the present invention, the compartment wall W may include an upper wall WU and a lower wall WL, wherein the passage CH is located between the upper wall WU and the lower wall WL. According to an embodiment of the present invention, the upper wall WU and the lower wall WL may have different thicknesses, for example, the thickness of the upper wall WU is about 50 mm, and the thickness of the lower wall WL is about 30 mm, but it is not limited thereto.

In addition, a fan filter unit FFU-1 and a fan filter unit FFU-2 may be respectively provided on the upper portions of the process station 10 and the cassette station 20 to filter air.

According to an embodiment of the present invention, the robot arm AR includes a substrate carriage P. When the substrate 100 is transferred between the process station 10 and the cassette station 20, the substrate 100 is placed on the substrate carriage P, and the substrate 100 horizontally passes along a first direction D1 through the passage CH located at the interface 30 between the process station 10 and the cassette station 20.

According to an embodiment of the present invention, the substrate processing apparatus 1 further includes a transfer plate TRS provided in the process station 10. The substrate 100 is placed on the transfer plate TRS before being transported by the substrate carriage P. According to an embodiment of the present invention, the transfer plate TRS is a cooling plate for cooling the substrate 100.

One technical feature of the present invention is that the substrate processing apparatus 1 further includes a substrate scanner SS, which is disposed at the interface 30 between the process station 10 and the cassette station 20. During the transmission of the substrate 100, the substrate 100 passes through the passage CH in the first direction $D_1$, and the substrate scanner SS can simultaneously capture the surface image data of the substrate 100 passing through the passage CH from a second direction $D_2$. The second direction $D_2$ is substantially perpendicular to the first direction $D_1$.

According to an embodiment of the present invention, the substrate scanner SS includes an image sensor device CS, which is disposed above the top surface 100a of the substrate 100 to capture surface image data of the substrate 100. The substrate scanner SS may be a line scanner, and the image sensor device CS may include a stripe-shaped scanning bar SB to capture line-shaped surface image of the substrate 100 at a pre-selected line rate of about 4.5K line/second. According to an embodiment of the present invention, the substrate scanner SS has a pixel size of about 47 μm. According to an embodiment of the present invention, a length of the image sensor device CS is equal to or greater than a diameter of the substrate 100.

According to an embodiment of the present invention, the substrate scanner SS further includes a light emitting device IL disposed between the image sensor device CS and the top surface 100a of the substrate 100. The light emitting device IL produces a scan line LS impinging onto the top surface 100a of the substrate 100. The reflected light RS comprising the surface image data is detected by the image sensor device CS.

According to an embodiment of the present invention, the light-emitting device IL includes a filter F that blocks blue and ultraviolet light from the light source IS of the light-emitting device IL. The light source IS may be a light-emitting diode (LED) light source and may have illuminance of at least 50,000 lux.

Figure 2:
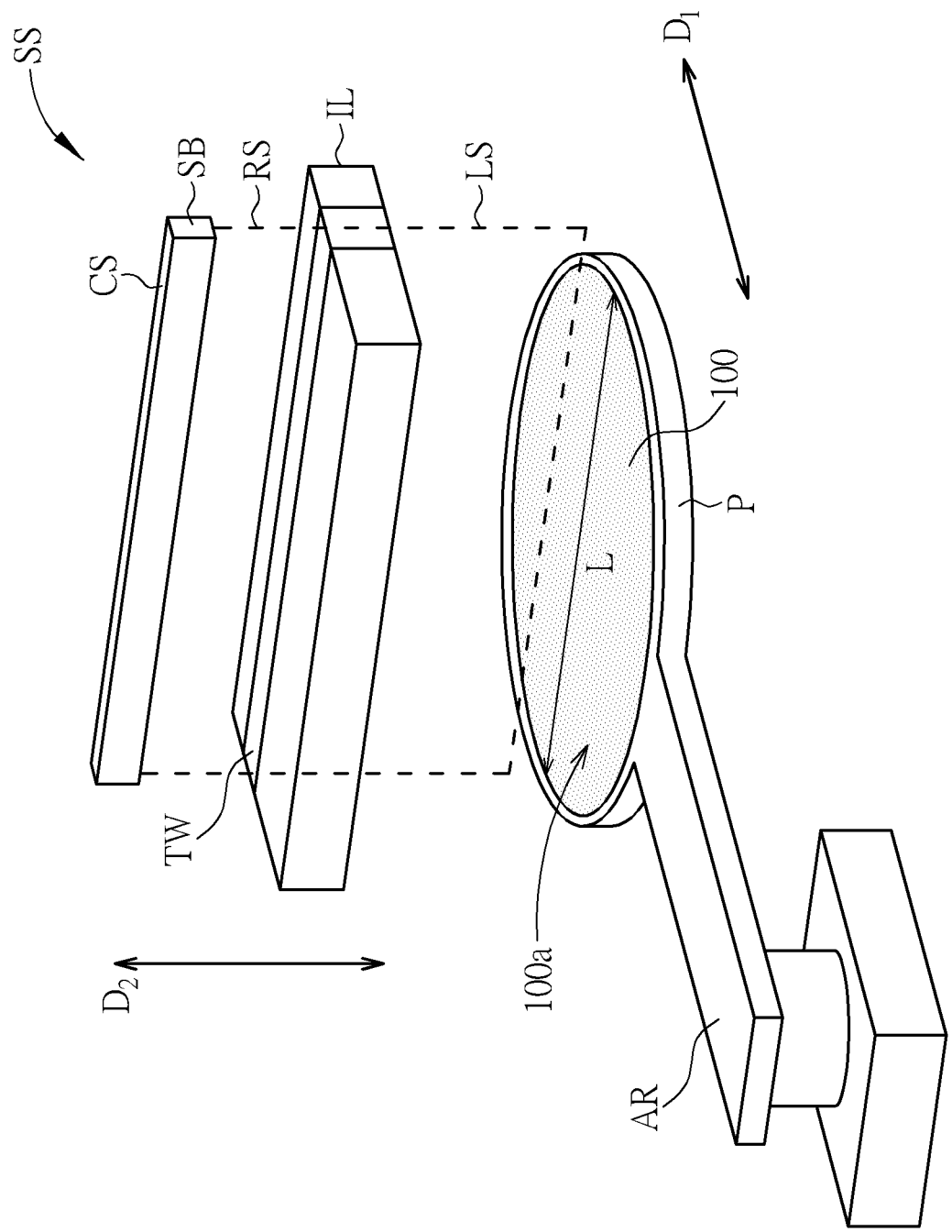
FIG. 2 illustrates the stripe-shaped scanning bar, the light-emitting device, the substrate, and the robot arm in a side perspective view.

Please also refer to FIG. 2, which illustrates the stripe-shaped scanning bar SB, the light-emitting device IL, the substrate 100, and the robot arm AR in a side perspective view. As shown in FIG. 2, according to an embodiment of the present invention, the longitudinal length of the scan line LS is equal to or greater than the diameter L of the substrate 100. According to an embodiment of the present invention, the diameter L of the substrate 100 may be 200 mm or 300 mm, but is not limited thereto. The light-emitting device IL includes a stripe-shaped transparent window TW that allows the scan line LS and the reflected light RS to pass therethrough.

When scanned by the substrate scanner SS, the substrate carriage P picks up the substrate 100 from the transfer plate TRS and the substrate 100 moves at a constant moving speed when passing through the passage CH at the interface 30 between the process station 10 and the cassette station 20. According to an embodiment of the present invention, the top surface 100a of the substrate 100 can be completely scanned by the substrate scanner SS within two seconds, and all images of the top surface 100a of the substrate 100 are captured. The information is transmitted to the control computer CP, and the online and real-time comparison with the normal image (for example, the image of the control wafer) can quickly find the abnormality of the chip and immediately decide whether to continue the process flow or to rework.

Figure 3:
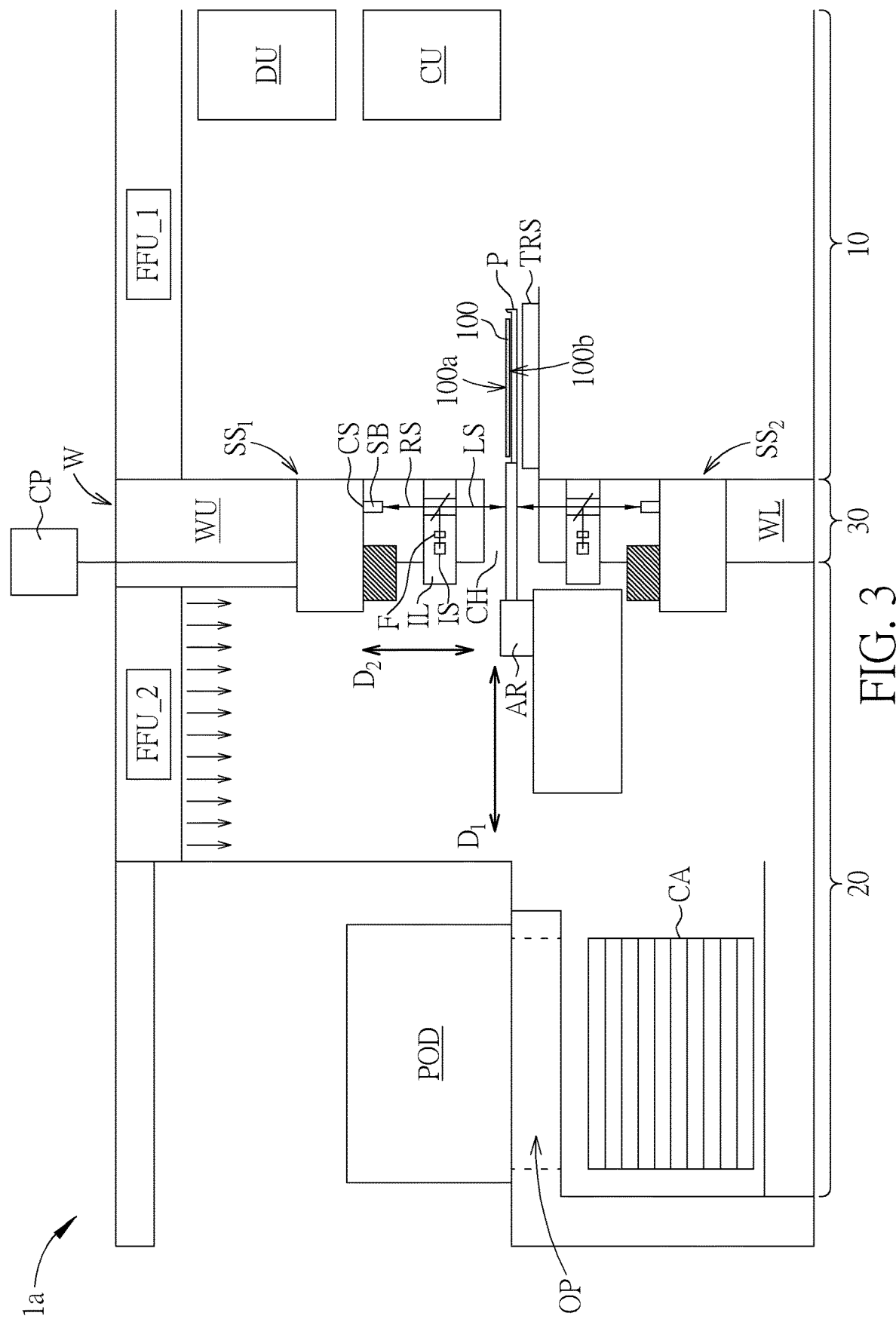
FIG. 3 illustrates a substrate processing apparatus according to another embodiment of the present invention.

Please refer to FIG. 3, which illustrates a substrate processing apparatus according to another embodiment of the present invention. As shown in FIG. 3, the substrate processing apparatus 1a also includes a process station 10 for processing a substrate 100, such as a silicon wafer. For example, the process station 10 may include a resist coating unit CU and a developing process unit DU. The substrate 100 may be transferred to the resist coating unit CU or the development processing unit DU via a robot arm (not shown) provided in the process station 10, and the photoresist coating process or the development process may be performed, respectively. According to an embodiment of the present invention, the substrate 100 subjected to the photoresist coating process may further be subjected to an exposure process.

According to an embodiment of the present invention, the substrate processing apparatus 1a also includes a cassette station 20 integrated with the process station 10. According to an embodiment of the present invention, likewise, a compartment wall W is provided at the interface 30 between the cassette station 20 and the process station 10. The compartment wall W is provided with a passage CH, which allows the robot arm AR in the cassette station 20 to transfer the substrate 100 between the process station 10 and the cassette station 20, and transfers the substrate 100 to the cassette CA for storage. The cassette CA can be loaded into the wafer carrier POD through the opening OP.

According to an embodiment of the present invention, the robot arm AR includes a substrate carriage P. When the substrate 100 is transferred between the process station 10 and the cassette station 20, the substrate 100 is placed on the substrate carriage P, and the substrate 100 horizontally passes along a first direction D1 through the passage CH located at the interface 30 between the process station 10 and the cassette station 20.

According to an embodiment of the present invention, the substrate processing apparatus 1a further includes a transfer plate TRS provided in the process station 10. The substrate 100 is placed on the transfer plate TRS before being transported by the substrate carriage P. According to an embodiment of the present invention, the transfer plate TRS is a cooling plate for cooling the substrate 100.

According to an embodiment of the present invention, the substrate processing apparatus 1a includes two substrate scanners SS1 and SS2, which scan the top surface 100a and the rear surface 100b of the substrate 100, respectively. The substrate scanner SS1 is disposed in the upper wall WU at the interface 30 between the process station 10 and the cassette station 20. During the transmission of the substrate 100, the substrate 100 passes through the passage CH in the first direction $D_1$, and the substrate scanner SS1 can simultaneously capture the top surface image data of the substrate 100 passing through the passage CH from a second direction $D_2$. The substrate scanner SS2 is disposed in the lower wall WL at the interface 30 between the process station 10 and the cassette station 20. During the transmission of the substrate 100, the substrate 100 passes through the passage CH in the first direction $D_1$, and the substrate scanner SS1 can simultaneously capture the rear surface image data of the substrate 100 passing through the passage CH from a second direction $D_2$. The detailed structure of the substrate scanner SS2 is similar to the substrate scanner SS1 as depicted in FIG. 1 and will not be described in further detail.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A substrate processing apparatus, comprising:
   a process station for processing a substrate;
   a cassette station integrated with said process station;
   a compartment wall disposed at an interface between said cassette station and said process station, wherein said compartment wall is provided with a passage, which allows a robot arm in said cassette station to transfer said substrate between said process station and said cassette station;
   a substrate carriage equipped for transferring said substrate between said process station and said cassette station through said passage located at said interface between said process station and said cassette station; and
   a substrate scanner disposed in the compartment wall at said interface between said process station and said cassette station for capturing surface image data during transportation of said substrate that passes through said passage.

2. The substrate processing apparatus according to claim 1, wherein said substrate scanner comprises an image sensor device disposed above a top surface of said substrate.

3. The substrate processing apparatus according to claim 2, wherein said substrate scanner is a line scanner that captures line-shaped surface image of said substrate at a pre-selected line rate of about 4.5K line/second.

4. The substrate processing apparatus according to claim 2, wherein said substrate scanner has a pixel size of about 47 μm.

5. The substrate processing apparatus according to claim 3 further comprising a light emitting device disposed between said image sensor device and said top surface of said substrate.

6. The substrate processing apparatus according to claim 5, wherein said light emitting device produces a scan line impinging onto said top surface of said substrate, and wherein a reflected light comprising said surface image data is detected by said image sensor device.

7. The substrate processing apparatus according to claim 6, wherein said light emitting device comprises a filter that blocks blue light and UV light from a light source of said light emitting device.

8. The substrate processing apparatus according to claim 7, wherein said light source is light-emitting diode (LED) light source and has illuminance of about 50,000 lux.

9. The substrate processing apparatus according to claim 6, wherein a longitudinal length of said scan line is equal to or greater than a diameter of said substrate.

10. The substrate processing apparatus according to claim 6, wherein said light emitting device comprises a stripe-shaped transparent window that allows said scan line and said reflected light to pass therethrough.

11. The substrate processing apparatus according to claim 1, wherein said top surface of said substrate is completely scanned by said substrate scanner in two seconds.

12. The substrate processing apparatus according to claim 1 further comprising a transfer plate equipped in said process station, wherein said substrate is mounted on said transfer plate before being transported by said substrate carriage.

13. The substrate processing apparatus according to claim 12, wherein said transfer plate is a cooling plate for cooling said substrate.

14. The substrate processing apparatus according to claim 12, wherein said substrate carriage picks up said substrate from said transfer plate and passes through said passage at said interface between said process station and said cassette station in a constant moving speed when scanned by said substrate scanner.

15. The substrate processing apparatus according to claim 1, wherein said process station comprises a resist coating unit and a developing process unit.

16. The substrate processing apparatus according to claim 1, wherein said process station comprises a chemical mechanical polishing (CMP) station.

17. The substrate processing apparatus according to claim 1, wherein said process station comprises an etching station.

18. A substrate processing apparatus, comprising:
a process station for processing a substrate;
a cassette station integrated with said process station;
a compartment wall disposed at an interface between said cassette station and said process station, wherein said compartment wall is provided with a passage, which allows a robot arm in said cassette station to transfer said substrate between said process station and said cassette station;
a substrate carriage equipped for transferring said substrate between said process station and said cassette station through said passage located at said interface between said process station and said cassette station; and
two substrate scanners disposed in the compartment wall at said interface between said process station and said cassette station for capturing surface image data during transportation of said substrate that passes through said passage, wherein said two substrate scanners scan a top surface and a rear surface of said substrate, respectively.

* * * * *

UNITED STATES PATENT AND TRADEMARK OFFICE
CERTIFICATE OF CORRECTION

PATENT NO. : 11,551,955 B2  
APPLICATION NO. : 16/831739  
DATED : January 10, 2023  
INVENTOR(S) : Lai et al.

Page 1 of 1

It is certified that error appears in the above-identified patent and that said Letters Patent is hereby corrected as shown below:

On the Title Page

Item (30), Add:  
--(30) Foreign Application Priority Data  
Mar. 05, 2020 (CN) .................... 202010147742.2--.

Signed and Sealed this
Thirteenth Day of February, 2024

Katherine Kelly Vidal
*Director of the United States Patent and Trademark Office*